United States Patent [19]
Ikeda et al.

[11] Patent Number: 5,182,661
[45] Date of Patent: Jan. 26, 1993

[54] THIN FILM FIELD EFFECT TRANSISTOR ARRAY FOR USE IN ACTIVE MATRIX LIQUID CRYSTAL DISPLAY

[75] Inventors: Naoyasu Ikeda; Ken-ichi Nakamura, both of Tokyo, Japan

[73] Assignee: NEC Corporation, Tokyo, Japan

[21] Appl. No.: 720,340

[22] Filed: Jun. 25, 1991

[30] Foreign Application Priority Data

Jun. 25, 1990 [JP] Japan .................. 2-165907

[51] Int. Cl.⁵ .............................................. G02F 1/13
[52] U.S. Cl. ........................................ 359/54; 359/59; 359/87; 359/88
[58] Field of Search ............... 357/4, 23.7; 340/784 C; 359/54, 59, 62, 87, 88

[56] References Cited

U.S. PATENT DOCUMENTS

| | | | |
|---|---|---|---|
| 4,778,560 | 10/1988 | Takeda et al. | 359/59 |
| 5,017,984 | 5/1991 | Tanaka et al. | 357/23.7 |
| 5,028,122 | 7/1991 | Hamada et al. | 359/54 |
| 5,042,916 | 8/1991 | Ukai et al. | 357/23.7 |
| 5,051,570 | 9/1991 | Tsujikawa et al. | 359/59 |

FOREIGN PATENT DOCUMENTS

| | | | |
|---|---|---|---|
| 0263589 | 4/1988 | European Pat. Off. | 359/60 |
| 60-230117 | 11/1985 | Japan | 359/59 |
| 2-72392 | 3/1990 | Japan | 340/784 C |
| 2-124536 | 5/1990 | Japan | 359/54 |

OTHER PUBLICATIONS

An Amorphous Si TFT Array with TaOx/SiNx Double Layered Insulator for Liquid Crystal Displays, 1988 International Display Research Conference, pp. 155–158, Etsuya Takeda et al.

*Primary Examiner*—Rolf Hille
*Assistant Examiner*—Minhloan Tran
*Attorney, Agent, or Firm*—Sughrue, Mion, Zinn, Macpeak & Seas

[57] ABSTRACT

A thin film field effect transistor array includes several parallel gate bus lines formed on a transparent insulative substrate, and several parallel drain bus lines formed on the transparent insulative substrate so as to intersect the gate bus lines. Several pixel electrodes are each formed in proximity of a corresponding one of intersections between the gate bus lines and the drain bus lines, and several thin film field effect transistors are each formed in proximity of a corresponding one of intersections between the gate bus lines and the drain bus lines. Each of the thin film field effect transistors is connected to a corresponding one of the pixel electrodes. Several of storage capacitors are each formed in proximity of and connected in parallel to a corresponding one of the pixel electrodes. Each of the storage capacitors is formed of a stacked structure having at least first, second and third level capacitor electrodes which are stacked in the named order and separated from each other by an intervening insulating layer. At least one of the first and third level capacitor electrodes is connected to a corresponding one of the gate bus lines.

15 Claims, 7 Drawing Sheets

THIN FILM FIELD EFFECT TRANSISTOR ARRAY FOR USE IN ACTIVE MATRIX LIQUID CRYSTAL DISPLAY

BACKGROUND OF THE INVENTION

1. Field of the Invention

The present invention relates to an active matrix liquid crystal display, and more specifically to a thin film field effect transistor array used in the active matrix liquid crystal display and having a storage capacitance formed by utilizing a gate bus line.

2. Description of Related Art

At present, liquid crystal displays have been focused as a flat display panel for portable computers and wall mounting type television displays. In particular, active matrix type liquid crystal displays composed of an array of thin film field effect transistors formed on a glass plate and each used as a switching element for an associated pixel, have been expected for application to the television displays and others, since they have possibility of a full color display. Therefore, the active matrix type liquid crystal displays are being actively studied and developed by many research organizations.

In this active matrix type liquid crystal display, a high picture quality and a high definition are current important problems. For this purpose, a method of providing a storage capacitance in parallel with a pixel capacitance has been known. The storage capacitance can be realized either by forming a storage capacitance line independently of the thin film field effect transistor, or by utilizing the gate bus line of a preceding stage thin film field effect transistor. The latter is very effective, since it is not necessary to provide, within each pixel, an opposing electrode and a bus line for the storage capacitance, and since it is possible to avoid increase of manufacturing processes.

One example of the storage capacitance realized by utilizing the gate bus line has been proposed by E. Takeda et al. in 1988 INTERNATIONAL DISPLAY RESEARCH CONFERENCE, pages 155-158. In this case, the gate electrode of a preceding stage thin film field effect transistor is extended to overlap with a succeeding stage pixel.

Here, in order to obtain a high quality of displayed image by preventing flicker and/or crosstalk, it is necessary to provide the storage capacitance as large as possible. However, if the storage capacitance is made large in the above mentioned prior art storage capacitance realized by utilizing the gate bus line, an area of the electrode for the storage capacitance must be inevitably made large, with the result that an aperture ratio in the pixel matrix section decreases. This means that a bright image having high contrast cannot be obtained.

SUMMARY OF THE INVENTION

Accordingly, it is an object of the present invention to provide an active matrix type liquid crystal display which has overcome the above mentioned defect of the conventional one.

Another object of the present invention is to provide a thin film field effect transistor array used in an active matrix liquid crystal display, which has a structure capable of having a large storage capacitance, with reducing or minimizing the decrease of the aperture ratio which would be caused by increase of the storage capacitance in the prior art.

The above and other objects of the present invention are achieved in accordance with the present invention by a thin film field effect transistor array comprising a plurality of parallel gate bus lines, and a plurality of parallel drain bus lines so as to intersect the gate bus lines. A plurality of pixel electrodes are each formed in proximity of a corresponding one of intersections between the gate bus lines and the drain bus lines, and a plurality of thin film field effect transistors are each formed in proximity of a corresponding one of intersections between the gate bus lines and the drain bus lines. Each of the thin film field effect transistors is connected to a corresponding one of the pixel electrodes. A plurality of storage capacitors are each formed in proximity of and connected in parallel to a corresponding one of the pixel electrodes. Each of the storage capacitors is formed of a stacked structure having at least first, second and third level capacitor electrodes which are stacked in the named order and separated from each other by an intervening insulating layer. At least one of the first, second and third level capacitor electrodes is connected to a corresponding one of the gate bus lines.

The above and other objects, features and advantages of the present invention will be apparent from the following description of preferred embodiments of the invention with reference to the accompanying drawings.

DESCRIPTION OF THE PREFERRED EMBODIMENTS

Figure 1:
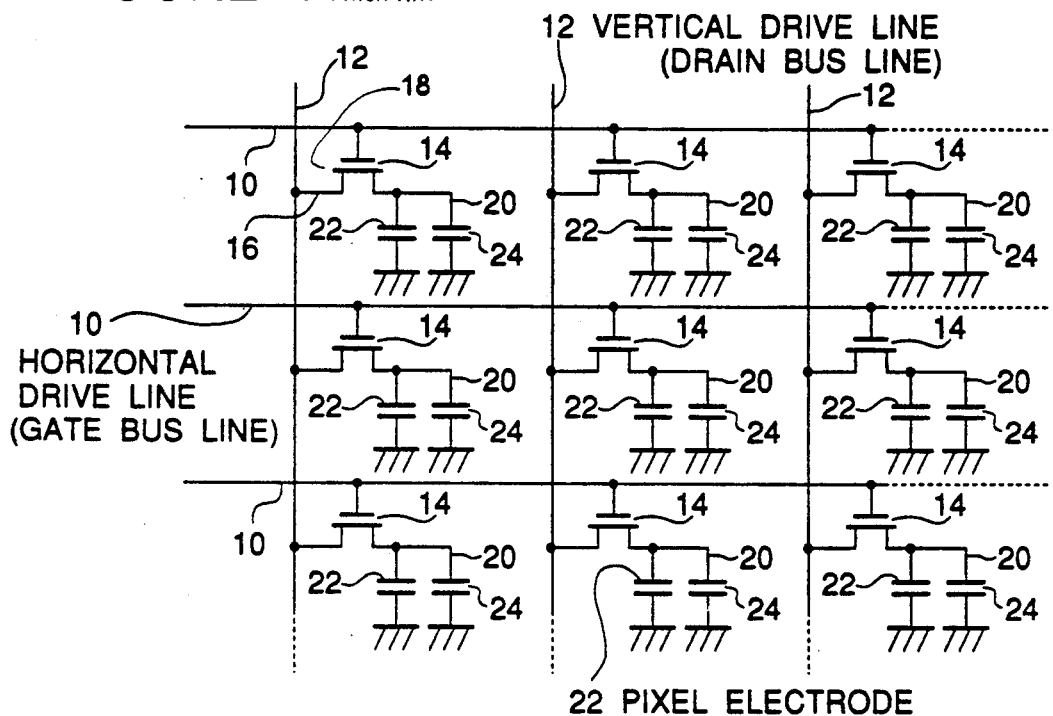
FIG. 1 is a circuit diagram of a general active matrix liquid crystal display panel, in which a storage capacitance is formed in parallel to each pixel capacitance.

Referring to FIG. 1, there is shown a circuit diagram of a general active matrix liquid crystal display panel, in which a storage capacitance is formed in parallel to each pixel capacitance.

The active matrix liquid crystal display panel comprises a number of horizontal drive lines or gate bus lines 10, and a number of vertical drive lines or drain bus lines 12 intersecting the gate bus lines 10, so that a matrix is formed by cooperation of the gate bus lines 10 and drain bus lines 12. On each of intersecting points between the gate bus lines 10 and the drain bus lines 12, one pixel is formed.

Namely, on each of the intersecting points between the gate bus lines 10 and the drain bus lines 12, one thin film transistor 14 is formed, which includes a drain 16 connected to a corresponding drain bus line 12, a gate 18 connected to a corresponding gate bus line 10 and a source 20 connected to a corresponding individual or pixel transparent electrode 22 and a storage capacitor 24.

Figure 2B:
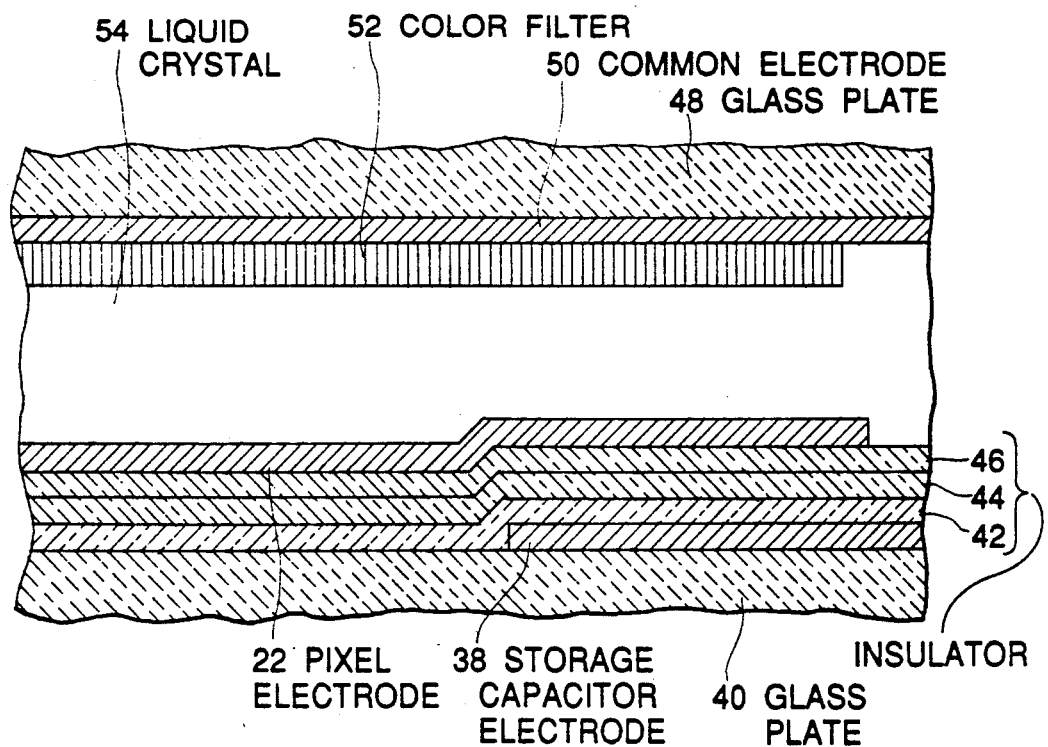
FIG. 2B is a diagrammatic partial sectional view taken along the line A—A in FIG. 2A.
Figure 2A:
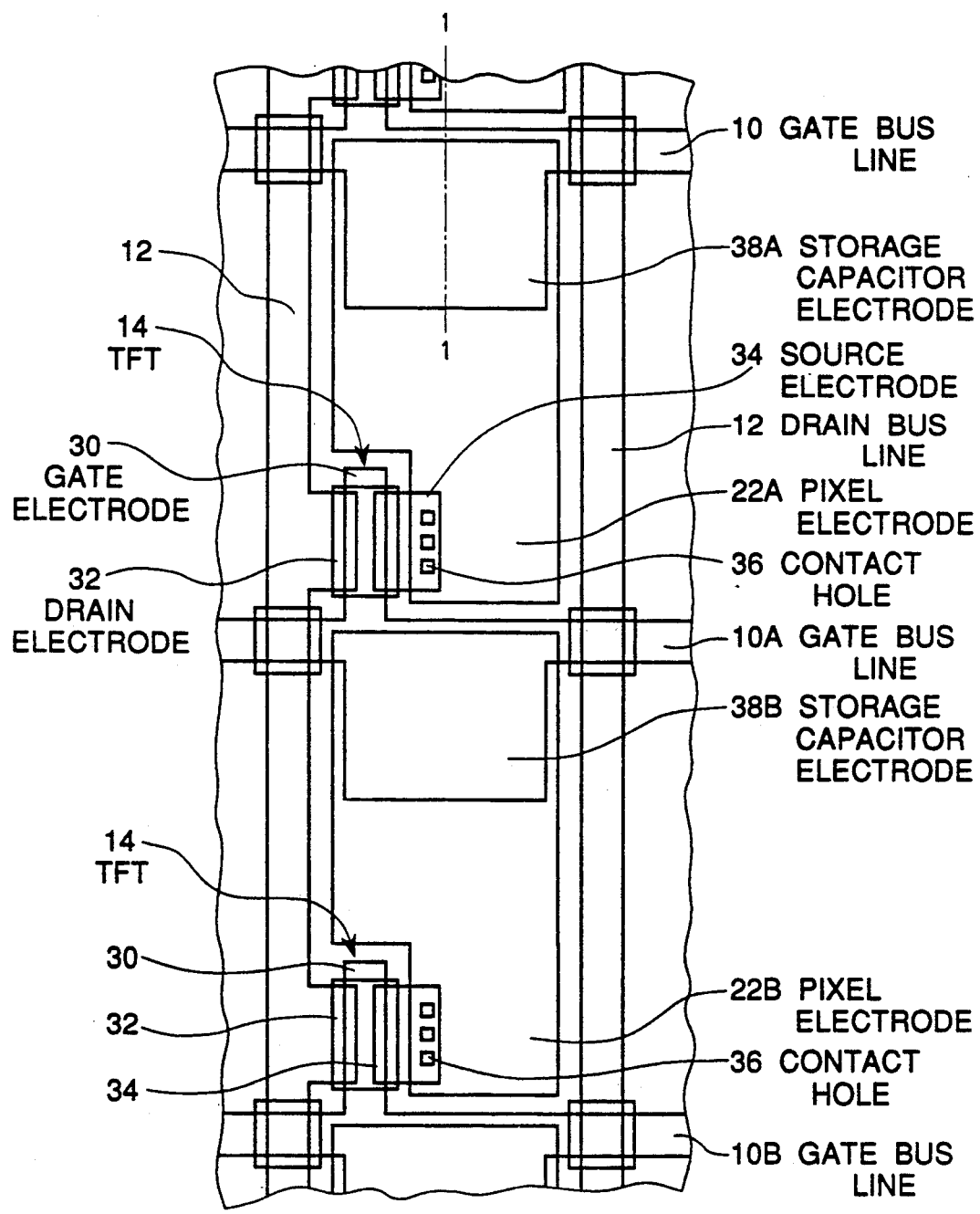
FIG. 2A is a diagrammatic partial layout pattern diagram of the conventional thin film field effect transistor array used in the active matrix liquid crystal display, in which a storage capacitance is formed by utilizing the gate bus line.

Referring to FIG. 2A, there is shown a diagrammatic partial layout pattern diagram of the conventional thin film field effect transistor array used in the active matrix liquid crystal display, which is based on the above mentioned technical conception proposed by E. Takeda et al. in 1988 INTERNATIONAL DISPLAY RESEARCH CONFERENCE, pages 155-158. FIG. 2B is a diagrammatic sectional view taken along the line A—A in FIG. 2A. In FIGS. 2A and 2B, elements similar to those shown in FIG. 1 are given the same reference numerals, and when elements having the same function should be distinguished from each other, the suffix "A" or "B" will be added to the reference numerals.

In FIG. 2A, each of the thin film transistors 14 has a gate electrode 30, a drain electrode 32 and a source electrode 34, all of which are formed of for example chromium. The source electrode 34 is connected to a corresponding pixel electrode 22 through a plurality of contact holes 36. The drain electrode 32 is integral with and continuous to the drain bus line 12, which is also formed of for example chromium.

The storage capacitor is formed by the pixel electrode 22 and an storage capacitor electrode 38 which is formed of an extension of the gate bus line 10. As shown in FIG. 2B, the storage capacitor electrode 38 and hence the gate bus line 10 (not shown in FIG. 2B) are formed on a glass plate 40, and a first insulator layer 42, a second insulator layer 44 and a surface protection layer 46 are also deposited on the glass plate 40 in the named order so as to cover the storage capacitor electrode 38 and hence the gate bus line 10. Furthermore, the pixel electrode 22 is formed on the surface protection layer 46. Accordingly, the storage capacitor is formed by the pixel electrode 22 and the storage capacitor electrode 38 which are separated by the three-layer insulator.

Another glass plate 48 is provided separately from the glass plate 40. The glass plate 48 has a common transparent electrode 50 formed to cover a surface of the glass plate 48, and a color filter 52 located selectively on the common transparent electrode 50. Liquid crystal 54 is filled in a space formed between the glass plates 40 and 48.

In the above mentioned structure, it would be readily understood that the storage capacitor is formed between the storage capacitor electrode 38 and a portion of the pixel electrode 22 that is overlapped or blinded by the storage capacitor electrode 38. Therefore, if an area of the storage capacitor electrode 38 is increased in order to increase the capacitance of the storage capacitor, the area of the portion of the pixel electrode 22 overlapped or blinded by the storage capacitor electrode 38 is correspondingly inevitably increased. As a result, the aperture ratio correspondingly lowers.

Here, explanation will be made about a basic operation of the active matrix liquid crystal display having the array of thin film field effect transistors each having the storage capacitor formed by utilizing the gate bus line. A scanning pulse is sequentially supplied to the gate bus lines 10, for example in the order of the gate bus lines 10→10A→10B in FIG. 2A, so that only thin film transistors receiving the scanning pulse are turned on so as to write a signal appearing on a corresponding drain bus line, to an associated pixel electrode.

Now, assume that a pulse is supplied to the gate bus line 10A. At this time, a voltage supplied through the drain bus line 12 is written to the pixel electrode 22A, so that an electric charge is stored in a storage capacitor formed between the storage capacitor electrode 38A and a portion of the pixel electrode 22A opposing to the storage capacitor electrode 38A, and in a pixel capacitor formed between the pixel electrode 22A and the common electrode 50 opposing to the pixel electrode 22A. Thereafter, the pulse is removed from the gate bus line 10A and applied to the gate bus line 10B, so that all the thin film transistors connected to the gate bus line 10A are turned off and the gate bus line 10A itself is brought to a constant voltage. On the other hand, the common electrode is maintained at a constant voltage. Therefore, after the thin film transistors connected to the gate bus line 10A are turned off, a voltage between the pixel electrode 22A and the common electrode 50 is unchanged, and a voltage between the pixel electrode 22A and storage capacitor electrode 38A is also unchanged. As a result, a constant voltage continues to be applied to the liquid crytal. This voltage is maintained until the pulse is supplied to the gate bus line 10A, again. Thus, one two-dimensional image can be displayed in the liquid crystal display panel as a whole, by sequentially scanning the gate bus lines by the pulse.

When the pulse is supplied to the gate bus line 10A, a voltage of the storage capacitor electrode 38B varies, so that a voltage between the pixel electrode 22B and the common electrode 50 also correspondingly varies. However, this voltage variation occurs only during a period in which the pulse is supplied to the gate bus line 10A, and the period is so extremely short that eyes of a human being cannot sense this short period. Therefore, this voltage variation is not a problem.

Figure 3A:
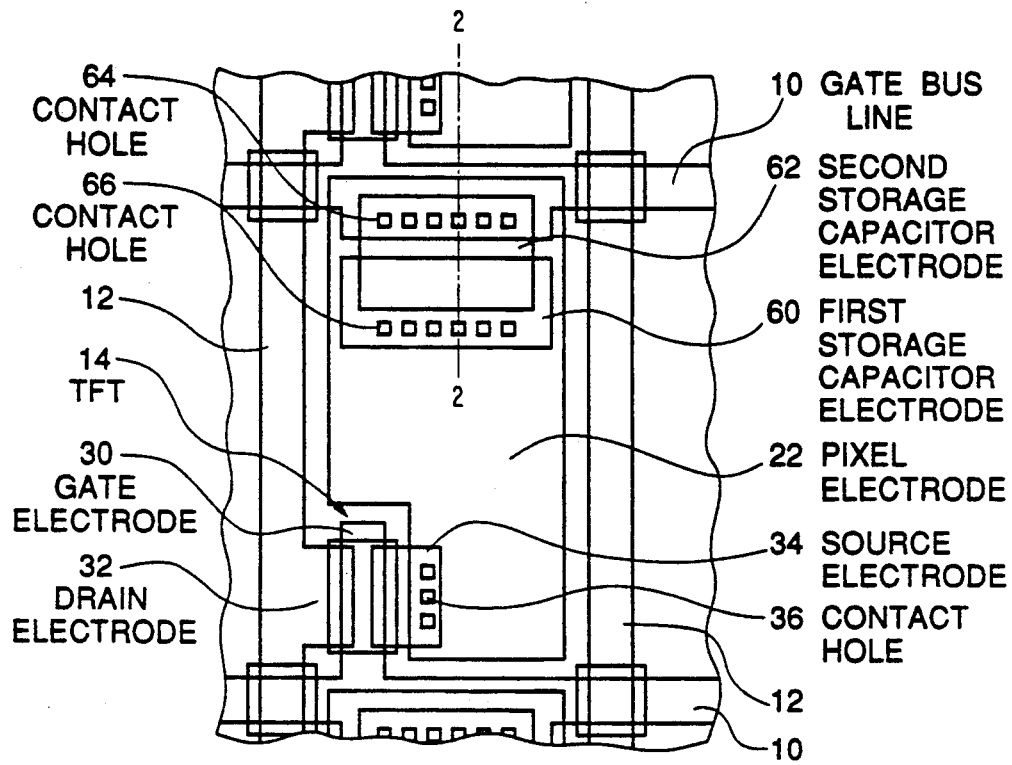
FIG. 3A is a diagrammatic partial layout pattern diagram of a first embodiment of the thin film field effect transistor array in accordance with the present invention and used in the active matrix liquid crystal display.
Figure 3B:
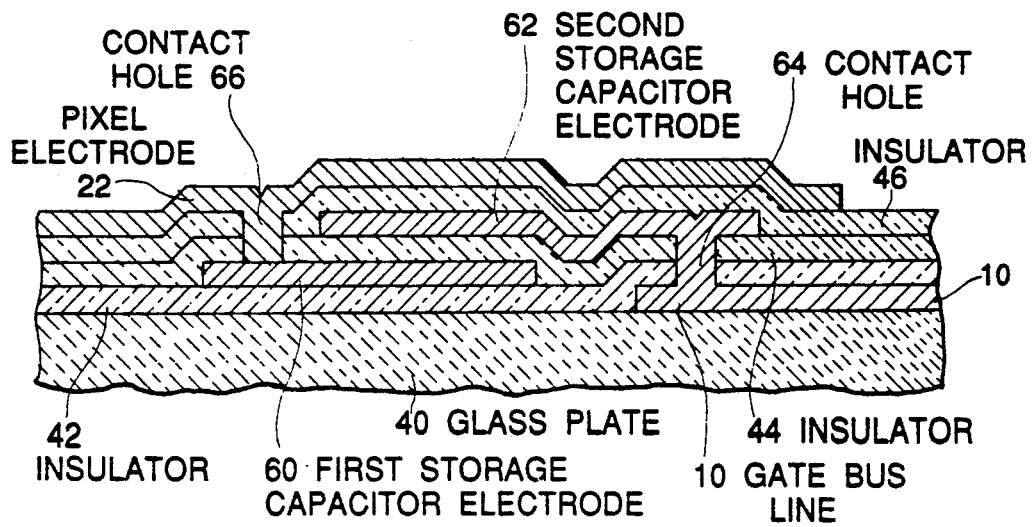
FIG. 3B is a diagrammatic partial sectional view taken along the line B—B in FIG. 3A.

Referring to FIG. 3A, there is shown a diagrammatic partial layout pattern diagram of a first embodiment of the thin film field effect transistor array in accordance with the present invention and used in the active matrix liquid crystal display. FIG. 3B shows a diagrammatic sectional view taken along the line B—B in FIG. 3A. In these figures, elements similar to those shown in FIGS. 1, 2A and 2B are given the same reference numerals, and explanation thereof will be omitted for simplification of description. In addition, in FIG. 3B, the common electrode, the glass plate and the color filters are omitted for simplification of the drawing and since those elements are similar to the conventional ones.

In the embodiment shown in FIGS. 3A and 3B, the chromium gate bus lines 10 are formed at the same time as when the chromium gate electrode 30 of each thin film transistor is formed, and the chromium drain electrode 32 and the chromium source electrode 34 of each thin film transistor are formed at the same time as when the chromium drain bus lines 12 are formed. Each pixel electrode 22 are formed of ITO (indium tin oxide).

As shown in FIG. 3B, the gate bus line 10 is formed on the glass plate 40, and the first insulator layer 42 of silicon oxide ($SiO_2$) is deposited on the glass plate 40 so as to cover the gate bus line 10. A first chromium storage capacitor electrode 60 is deposited on the first insulator layer 42 in such a manner that the first storage capacitor electrode 60 is offset from the gate bus line 10. The second insulator layer 44 of silicon nitride ($SiN_X$) is deposited on the first insulator layer 42 so as to cover the first storage capacitor electrode 60. In addition, a second chromium storage capacitor electrode 62 is deposited on the second insulator layer 44 so as to overlap the first storage capacitor electrode 60 and the gate bus line 10. The surface protection layer 46 of silicon nitride ($SiN_X$) is deposited on the second insulator layer 44 so as to cover the second storage capacitor electrode 62. Furthermore, the pixel electrode 22 is formed on the surface protection layer 46. The second chromium storage capacitor electrode 62 is interconnected to the gate bus line 10 through contact holes 64 which are formed to pierce through the first insulator layer 42 and the second insulator layer 44. The pixel electrode 22 is interconnected to the first storage capacitor electrode 60 through contact holes 66 which are formed to pierce through the second insulator layer 44 and surface protection layer 46. Accordingly, the storage capacitor is formed by the pixel electrode 22, the first storage capacitor electrode 60, and the second storage capacitor electrode 62 which are stacked in a three-layer structure.

The above mentioned storage capacitor structure could have a capacitance which is about twice as large as that of the conventional one (as shown in FIGS. 2A and 2B) having the single storage electrode of the same area as that of the second storage electrode of the above mentioned storage capacitor structure. In addition, the display panel having the above mentioned storage capacitor structure was actually prepared. The display panel thus prepared gave a high picture quality.

Figure 4A:
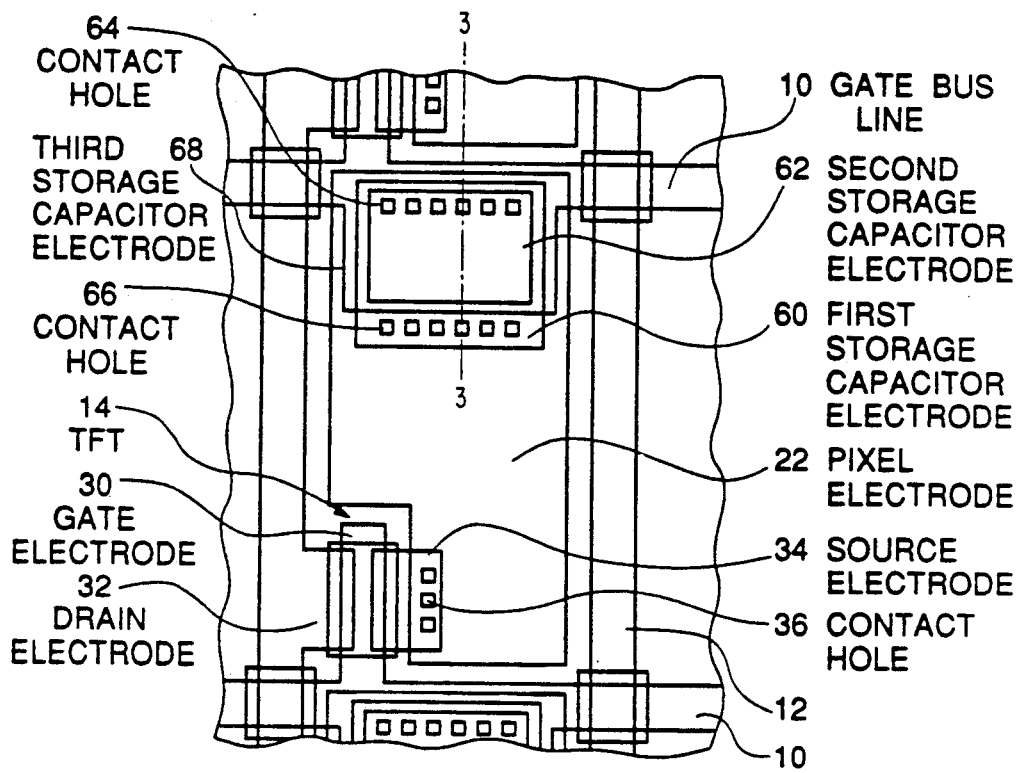
FIG. 4A is a diagrammatic partial layout pattern diagram of a second embodiment of the thin film field effect transistor array in accordance with the present invention and used in the active matrix liquid crystal display.
Figure 4B:
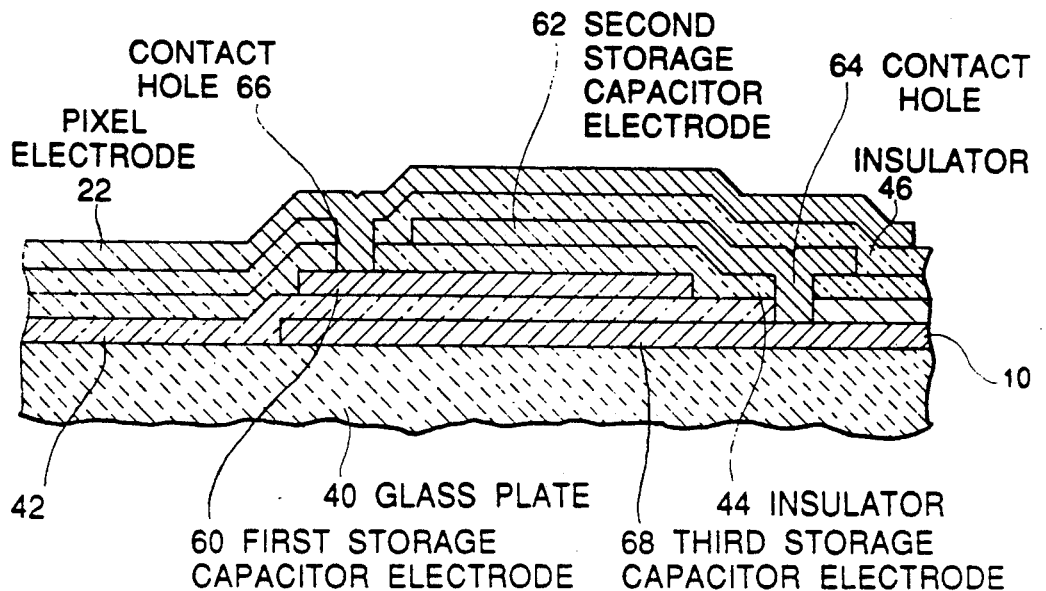
FIG. 4B is a diagrammatic partial sectional view taken along the line C—C in FIG. 4A.

Referring to FIGS. 4A and 4B, there is shown a modification of the embodiment shown in FIGS. 3A and 3B. In these figures, elements similar to those shown in FIGS. 3A and 3B are given the same reference numerals, and explanation thereof will be omitted for simplification of description.

As seen from comparison between FIGS. 3A and 3B and FIGS. 4A and 4B, the modification shown in FIGS. 4A and 4B is characterized in that a third storage capacitor electrode 68 formed of chromium is provided to extend from the gate bus line 10 underneath the first storage capacitor electrode 60, so that an additional storage capacitance is formed between the third storage capacitor electrode 68 and the first storage capacitor electrode 60. In other words, the storage capacitor can have a further increased capacitance.

As seen from the above, the embodiment shown in FIGS. 3A and 3B and FIGS. 4A and 4B can have the storage capacitance which is about double or more of the conventional one, without increasing the area of the storage capacitance in the plan view or layout pattern view. In addition, since the thickness of the insulator between opposing electrodes of the storage capacitor can be made thinner than the conventional one, the capacitance of the storage capacitor can be further increased. On the other hand, the embodiment shown in FIGS. 3A and 3B and FIGS. 4A and 4B that has the same storage capacitance as the conventional one, can be realized with an area in the plan or layout pattern view which is smaller than that of the conventional one. In this case, the effective area of the picture electrode, namely, the aperture ratio can be increased.

In the embodiment shown in FIGS. 3A and 3B and FIGS. 4A and 4B, the pixel electrode 22 has been formed of the ITO film, but can be formed of $In_2O_3$ or $SnO_3$. In addition, the gate insulator has been formed of $SiN_X$, but may be formed of $SiO_2$. The gate bus line, the drain bus line, and the electrodes of the storage capacitor has been formed of chromium, but can be formed of another metal, for example, Ta, Al, Mo, or Ti.

Figure 5A:
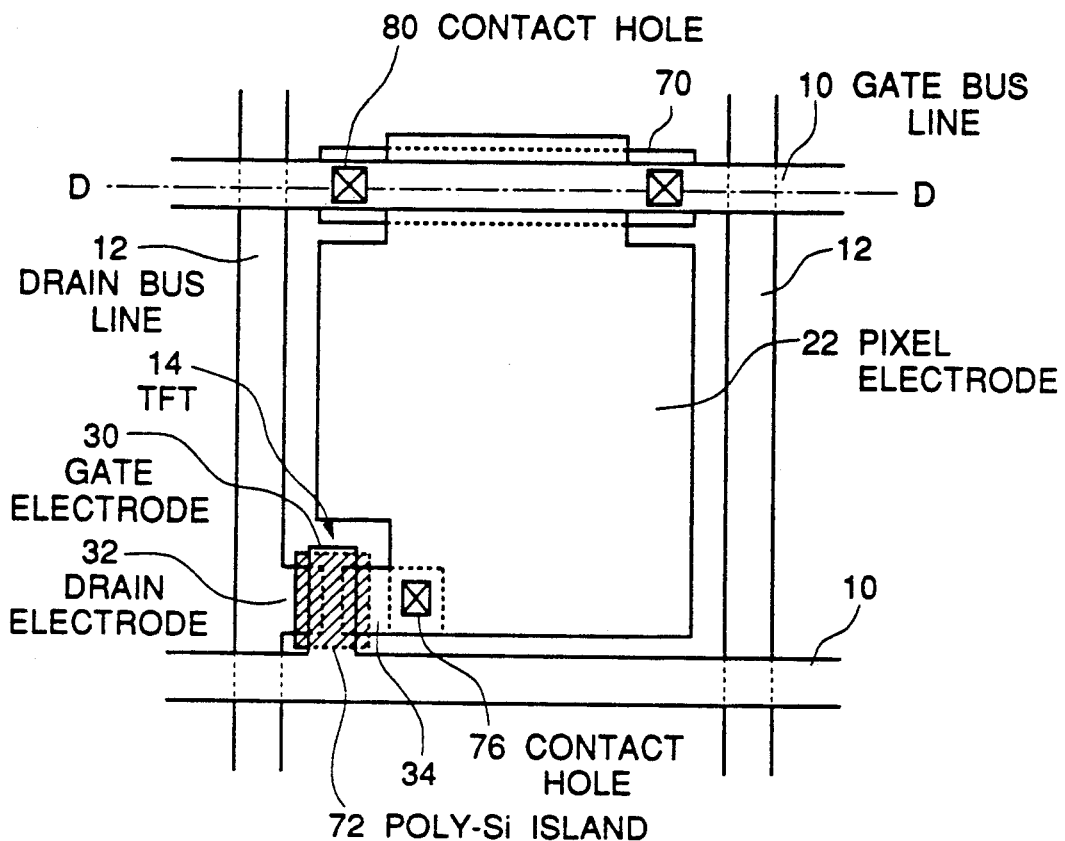
FIG. 5A is a diagrammatic partial layout pattern diagram of a third embodiment of the thin film field effect transistor array in accordance with the present invention and used in the active matrix liquid crystal display.
Figure 5B:
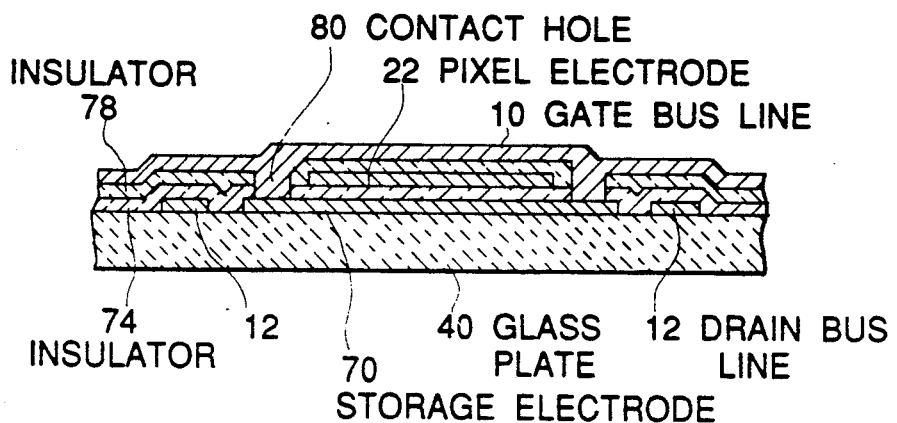
FIG. 5B is a diagrammatic partial sectional view taken along the line D—D in FIG. 5A.

Referring to FIG. 5A, there is shown a diagrammatic partial layout pattern diagram of a third embodiment of the thin film field effect transistor array in accordance with the present invention, in which each thin film field effect transistor is of a non-inverted staggered configuration. FIG. 5B is a diagrammatic sectional view taken along the line D—D in FIG. 5A. In these figures, elements similar to those shown in FIGS. 1, 2A and 2B are given the same reference numerals, and explanation thereof will be omitted for simplification of description. In addition, in FIG. 5B, the common electrode, and the glass plate and the color filter are omitted for simplification of the drawing and since those elements are similar to the conventional ones.

In this third embodiment, the drain bus line 12, the drain electrode 32, the source electrode 36, and a storage electrode 70 are formed on the glass plate 40, for example by depositing, on the glass plate 40 which is transparent and has been cleaned, an $n^+$-polysilicon layer of 1500 Å thickness containing a high concentration of phosphorus by means of a LPCVD (low pressure chemical vapor deposition) process, and then by patterning the deposited layer by means of photolithographic process. A non-doped polysilicon island of 500 Å thickness is formed only in a thin film transistor formation region so as to partially overlap the drain electrode 32 and the source electrode 34, for example by depositing a non-doped polysilicon layer of 500 Å thickness by means of the LPCVD process and then by patterning the deposited layer by means of photolithographic process.

An insulator layer 74 of $SiO_2$ having the thickness of 1000 Å is formed to cover the whole surface of the plate by means of the LPCVD process. A contact hole 76 is formed in the insulator layer 74 above the source electrode 34, by means of the photolithography process. Then, a transparent pixel electrode 22 is formed on the insulator layer 74 by, for example, depositing an ITO film of 500 Å thickness by means of an RF sputtering, and then by patterning the deposited ITO film by means of photolithographic process. In this process, the transparent pixel electrode 22 is connected to the source electrode 34 through the contact hole 76 formed in the insulator layer 74.

A second insulator layer 78 of $SiO_2$ having the thickness of 1000 Å is formed to cover the whole surface of the plate by means of the LPCVD process. Contacts hole 80 are formed in the insulator layers 74 and 78 above the storage electrode 70, by means of the photolithography process. Thereafter, the gate electrode electrode 30 and the gate bus line 10 are formed on the second insulator layer 78 by, for example, depositing an aluminum film of 2000 Å thickness by means of an RF sputtering, and then by patterning the deposited aluminum film by means of photolithographic process.

As seen from the above description with reference to FIGS. 5A and 5B, the third embodiment is characterized in that a portion of the transparent pixel electrode 22 overlaps and extends between the gate bus line 10 and the storage capacitor electrode 70 that is formed in alignment with the gate bus line 10. Namely, the storage capacitance is formed above and below the transparent pixel electrode 22. With this arrangement, the area of the storage electrode provided in a region excluding the gate bus lines and the drain bus lines can be greatly reduced in comparison with the conventional one. Therefore, if the same storage capacitance as that of the conventional one is formed, a high aperture ratio can be obtained.

In the third embodiment shown in FIGS. 5A and 5B, in addition, the storage electrode can be formed in the same plane as that of the source and drain electrodes of the thin film transistors, at the same time when the source and drain electrodes of the thin film transistors are formed. Therefore, the number of steps in the manufacturing process will not be increased.

The third embodiment shown in FIGS. 5A and 5B has been formed in the non-inverted staggered configuration of thin film field effect transistor array, by means of forming the storage capacitance by utilizing the preceding stage gate line. However, the structure shown in FIGS. 5A and 5B can be similarly applied to an inverted staggered configuration of thin film field effect transistor array, and to a co-planar configuration of thin film field effect transistor array, and a similar effect can be obtained.

Figure 6:
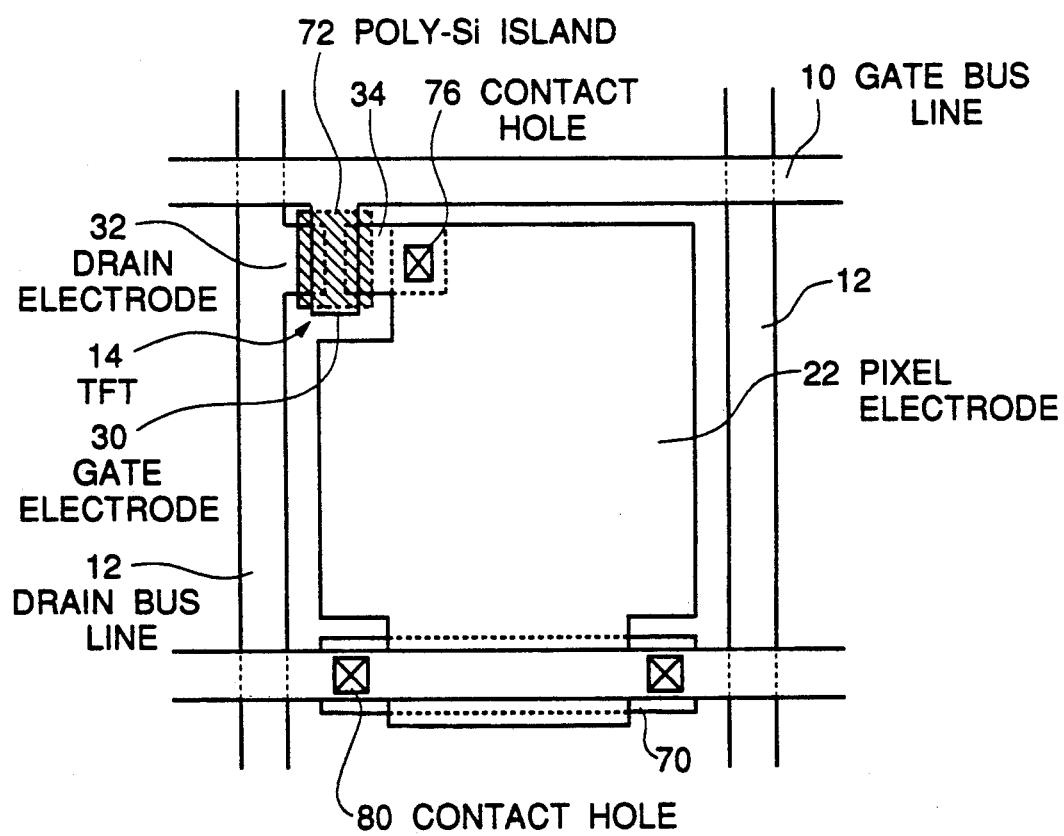
FIG. 6 is a diagrammatic partial layout pattern diagram of a fourth embodiment of the thin film field effect transistor array in accordance with the present invention and used in the active matrix liquid crystal display.

Referring to FIG. 6, there is shown a modification of the embodiment shown in FIGS. 5A and 5B. In this figure, elements similar to those shown in FIGS. 4A and 4B are given the same reference numerals.

This modification shown in FIG. 6 is the same as the embodiment shown in FIGS. 5A and 5B, except that the storage capacitance is formed by utilizing the succeeding stage gate line. This feature is apparent from FIG. 6. Therefore, further explanation of this modification will be omitted.

Figure 7:
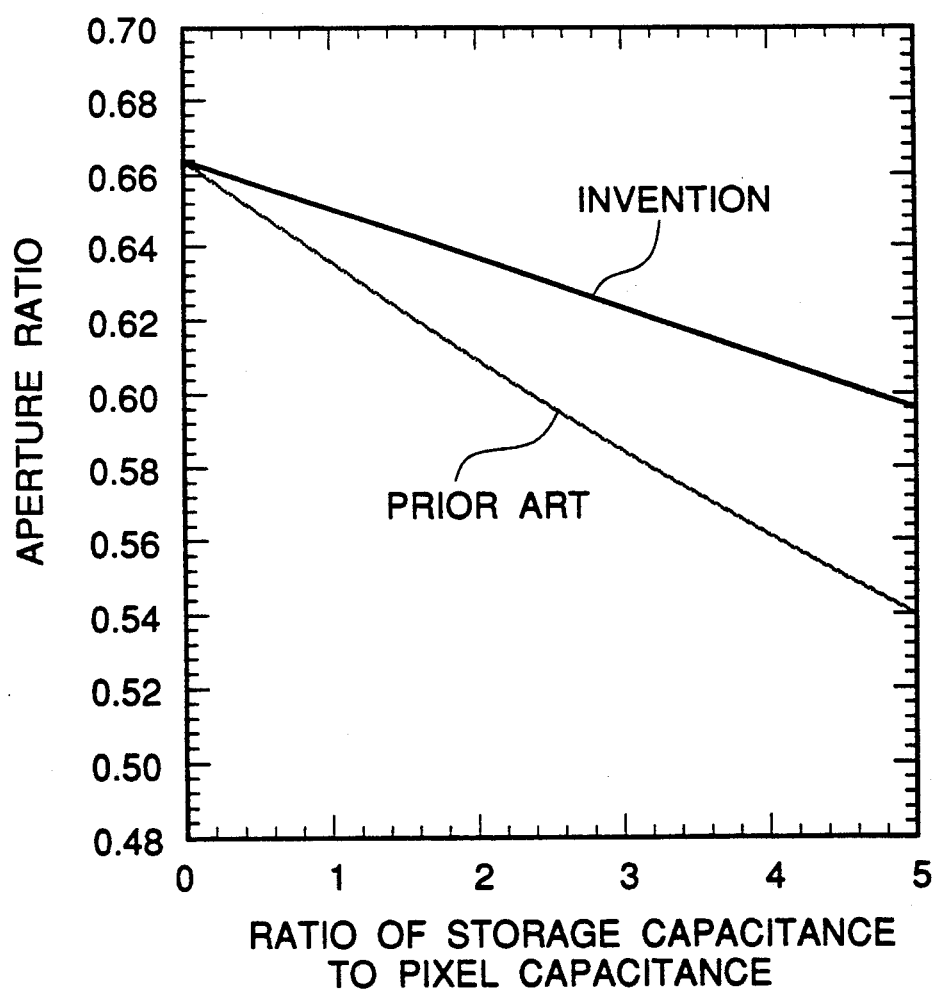
FIG. 7 is a graph illustrating a change in a ratio of storage capacitance to pixel capacitance as a function of the aperture ratio, in the present invention and in the prior art.

The active matrix liquid crystal display panel having the non-inverted staggered configuration of thin film field effect transistor array was actually prepared in accordance with the embodiment shown in FIGS. 5A and 5B, under the condition that a pixel pitch is 100 μm, a bus line width is 10 μm, and a distance between a bus line and a pixel electrode is 5 μm. A solid line in the graph of FIG. 7 shows a relation between the aperture ratio Ap and a ratio α of the storage capacitance to the liquid crystal capacitance, when the width of the gate bus line forming the storage capacitance is changed. A dotted line in the graph of FIG. 7 shows the case of the prior art.

As seen from FIG. 7, under the condition that the ratio α of the storage capacitance to the liquid crystal capacitance is 4, the aperture ratio is 56% in the prior art and 61% in the present invention. Namely, it would be understood that when the same storage capacitance is formed, a high aperture ratio can be obtained.

As seen from the above, the present invention can make it possible to form a large storage capacitance in the thin film field effect transistor array, by effectively utilizing the gate bus line so that the plan view area of the storage capacitor in the region excluding the bus lines can be reduced. Therefore, it is possible to provide a display having a large aperture ratio which prevents a decrease in the displayed image quality.

The invention has thus been shown and described with reference to the specific embodiments. However, it should be noted that the present invention is in no way limited to the details of the illustrated structures but changes and modifications may be made within the scope of the appended claims.

We claim:

1. A thin film field effect transistor array comprising a transparent insulative substrate, a plurality of parallel gate bus lines formed on said transparent insulative substrate, a plurality of parallel drain bus lines formed on said transparent insulative substrate so as to intersect said gate bus lines, a plurality of pixel electrodes each formed in proximity of a corresponding one of intersections between said gate bus lines and said drain bus lines, a plurality of thin film field effect transistors each formed in proximity of a corresponding one of intersections between said gate bus lines and said drain bus lines, each of said thin film field effect transistors being connected to a corresponding one of said pixel electrodes, and a plurality of storage capacitors each formed in proximity of and connected in parallel to a corresponding one of said pixel electrodes, each of said storage capacitors being formed of a stacked structure having at least first, second and third level capacitor electrodes which are stacked in the named order and separated from each other by an intervening insulating layer, at least one of said first, second and third level capacitor electrodes being connected to a corresponding one of said gate bus lines, wherein said gate bus line is formed on the transparent insulative substrate and a first insulator layer is formed to cover said gate bus line, wherein said first level capacitor electrode is formed on said first insulator layer so as to be offset from said gate bus line and a second insulator layer is formed to cover said first level capacitor electrode, wherein said second level capacitor electrode is formed on said second insulator layer so as to partially overlap said gate bus line and said first level capacitor electrode, said second level capacitor electrode being connected to said gate bus line through a contact hole formed to pierce through said first and second insulator layers, and said third insulator layer is formed to cover said second level capacitor electrode, and wherein said third level capacitor electrode is formed of said pixel electrode which is formed on said third insulator layer so as to overlap said second level capacitor electrode, said pixel electrode being connected to said first level capacitor electrode through a contact hole formed to pierce through said second and third insulator layers.

2. The thin film field effect transistor array as claimed in claim 1, wherein said storage capacitor further includes a fourth level capacitor electrode which is an extension of said gate bus line extending underneath said first level capacitor electrode, so that said storage capacitor is of a four-layer stacked structure.

3. The thin film field effect transistor array as claimed in claim 2, wherein said fourth level capacitor electrode is formed at the same level as that of said gate bus line.

4. A thin film field effect transistor array comprising a transparent insulative substrate, a plurality of parallel gate bus lines formed on said transparent insulative substrate, a plurality of parallel drain bus lines formed on said transparent insulative substrate so as to intersect said gate bus lines, a plurality of pixel electrodes each formed in proximity of a corresponding one of intersections between said gate bus lines and said drain bus lines, a plurality of thin film field effect transistors each formed in proximity of a corresponding one of intersections between said gate bus lines and said drain bus lines, each of said thin film field effect transistors being connected to a corresponding one of said pixel electrodes, and a plurality of storage capacitors each formed in proximity of and connected in parallel to a corresponding one of said pixel electrodes, each of said storage capacitors being formed of a stacked structure having at least first, second and third level capacitor electrodes which are stacked in the named order and separated from each other by an intervening insulating layer, at least one of said first, second and third level capacitor electrodes being connected to a corresponding one of said gate bus lines, wherein said first level capacitor electrode is formed on the transparent insulative substrate underneath said gate bus line within a region between a pair of adjacent drain bus lines, and a first insulator layer is formed to cover said first level capacitor electrode, wherein said second level capacitor electrode is formed of an extension of said pixel electrode which is formed to extend over said first insulator layer above said first level capacitor electrode, and a second insulator layer is formed to cover said second level capacitor electrode, wherein said third level capacitor electrode is formed of said gate bus line formed on said second insulator layer, said gate bus line being connected to said first level capacitor electrode through a contact hole formed to pierce through said first and second insulator layers.

5. An active matrix liquid crystal display comprising:
a thin film field effect transistor array comprising a first transparent insulative substrate, a plurality of parallel gate bus lines formed on said first transparent insulative substrate, a plurality of parallel drain bus lines formed on said first transparent insulative substrate so as to intersect said gate bus lines, a plurality of pixel electrodes each formed in proximity of a corresponding one of intersections between said gate bus lines and said drain bus lines, a plurality of thin film field effect transistors each formed in proximity of a corresponding one of intersections between said gate bus lines and said drain bus lines, each of said thin film field effect transistors being connected to a corresponding one of said pixel electrodes, and a plurality of storage capacitors each formed in proximity of and connected in parallel to a corresponding one of said pixel electrodes, each of said storage capacitors being formed of a stacked structure having at least first, second and third level capacitor electrodes which are stacked in the named order and separated from each other by an intervening insulating layer, at least one of said first, second and third level capacitor electrodes being connected to a corresponding one of said gate bus lines, wherein said gate bus line is formed on the first transparent insulative substrate and a first insulator layer is formed to cover said gate bus line, wherein said first level capacitor electrode is formed on said first insulator layer so as to be offset from said gate bus line and a second insulator layer is formed to cover said first level capacitor electrode, wherein said second level capacitor electrode is formed on said second insulator layer so as to partially overlap said gate bus line and said first level capacitor electrode, said second level capacitor electrode being connected to said gate bus line through a contact hole formed to pierce through said first and second insulator layers, and said third insulator layer is formed to cover said second level capacitor electrode, and wherein said third level capacitor electrode is formed of said pixel electrode which is formed on said third insulator layer so as to overlap said second level capacitor electrode, said pixel electrode being connected to said first level capacitor electrode through a contact hole formed to pierce through said second and third insulator layers;
a second transparent insulative substrate; and
a liquid crystal disposed between said first and second transparent insulative substrates.

6. The active matrix liquid crystal display as claimed in claim 5, wherein said storage capacitor electrode includes a fourth level capacitor electrode which is an extension of said gate bus line extending underneath said first level capacitor electrode, so that said storage capacitor is of a four-layer stacked structure.

7. The active matrix liquid crystal display as claimed in claim 6, wherein said fourth level capacitor electrode is formed at the same level as that of said gate bus line.

8. The active matrix liquid crystal display as claim in claim 5, further comprising a common transparent electrode formed to cover a surface of said second transparent insulative substrate.

9. The active matrix liquid crystal display as claimed in claim 8, further comprising a color filter disposed on a surface of said common electrode.

10. The active matrix liquid crystal display as claimed in claim 9, wherein said color filter is disposed on a part of the surface of said common electrode, and wherein said liquid crystal is disposed between said color filter and said pixel electrode, and between said pixel electrode and part of said common electrode.

11. An active matrix liquid crystal display comprising:
a thin film field effect transistor array comprising a first transparent insulative substrate, a plurality of parallel gate bus lines formed on said first transparent insulative substrate, a plurality of parallel drain bus lines formed on said first transparent insulative substrate so as to intersect said gate bus lines, a plurality of pixel electrodes each formed in proximity of a corresponding one of intersections between said gate bus lines and said drain bus lines, a plurality of thin film field effect transistors each formed in proximity of a corresponding one of intersections between said gate bus lines and said drain bus lines, each of said thin film field effect transistors being connected to a corresponding one of said pixel electrodes, and a plurality of storage capacitors each formed in proximity of and connected in parallel to a corresponding one of said pixel electrodes, each of said storage capacitors being formed of a stacked structure having at least first, second and third level capacitor electrodes which are stacked in the named order and separated from each other by an intervening insulating layer, at least one of said first, second and third level capacitor electrodes being connected to a corresponding one of said gate bus lines, wherein said first level capacitor electrode is formed on the first transparent insulative substrate underneath said gate bus line within a region between a pair of adjacent drain bus lines, and a first insulator layer is formed to cover said first level capacitor electrode, wherein said second level capacitor electrode is formed of an extension of said pixel electrode which is formed to extend over said first insulator layer above said first level capacitor electrode, and a second insulator layer is formed to cover said second level capacitor electrode, wherein said third level capacitor electrode is formed of said gate bus line formed on said second insulator layer, said gate bus line being connected to said first level capacitor electrode through a contact hole formed to pierce through said first and second insulator layers;

a second transparent insulative substrate; and a liquid crystal disposed between said first and second transparent insulative substrates.

12. The active matrix liquid crystal display as claim in claim 11, further comprising a common transparent electrode formed to cover a surface of said second transparent insulative substrate.

13. The active matrix liquid crystal display as claimed in claim 12, further comprising a color filter disposed on a surface of said common electrode.

14. The active matrix liquid crystal display as claimed in claim 13, wherein said color filter is disposed on a part of the surface of said common electrode, and wherein said liquid crystal is disposed between said color filter and said pixel electrode, and between said pixel electrode and part of said common electrode.

15. The active matrix liquid display as claimed in claim 11, wherein said display operates such that when a ratio of a storage capacitance to a liquid crystal capacitance is about 4, an aperture ratio Ap is about 61%.

* * * * *